(12) United States Patent
Clark

(10) Patent No.: US 11,424,236 B2
(45) Date of Patent: Aug. 23, 2022

(54) FACILITATING ALIGNMENT OF STACKED CHIPLETS

(71) Applicant: Tokyo Electron Limited, Tokyo (JP)

(72) Inventor: Robert Clark, Fremont, CA (US)

(73) Assignee: Tokyo Electron Limited, Tokyo (JP)

( * ) Notice: Subject to any disclaimer, the term of this patent is extended or adjusted under 35 U.S.C. 154(b) by 19 days.

(21) Appl. No.: 17/007,963

(22) Filed: Aug. 31, 2020

(65) Prior Publication Data

US 2021/0074696 A1 Mar. 11, 2021

Related U.S. Application Data

(60) Provisional application No. 62/896,633, filed on Sep. 6, 2019.

(51) Int. Cl.
*H01L 21/78* (2006.01)
*G06F 30/31* (2020.01)
(Continued)

(52) U.S. Cl.
CPC ............ *H01L 25/50* (2013.01); *G03F 1/42* (2013.01); *G06F 30/31* (2020.01); *H01L 21/78* (2013.01);
(Continued)

(58) Field of Classification Search
CPC ... H01L 25/50; H01L 25/0657; H01L 23/528; H01L 2225/06565; G06F 30/31; G03F 1/42
See application file for complete search history.

(56) References Cited

U.S. PATENT DOCUMENTS

2016/0178344 A1 6/2016 Farooq et al.
2017/0200707 A1 7/2017 Rogers et al.
(Continued)

FOREIGN PATENT DOCUMENTS

KR 10-2019-0107496 * 8/2019

OTHER PUBLICATIONS

Michallet, "CoolCube™: A True 3DVLSI Alternative to Scaling, Resource Library, Technologies Features," https://www.3dincites.com/2015/03/coolcube-a-true-3dvlsi-alternative-to-scaling/, Mar. 24, 2015, 16 pages.
(Continued)

*Primary Examiner* — Timor Karimy
(74) *Attorney, Agent, or Firm* — Slater Matsil, LLP

(57) ABSTRACT

In certain embodiments, a method for designing a semiconductor device includes generating a two-dimensional design for fabricating chiplets on a semiconductor substrate. The chiplets are component levels for a multi-chip integrated circuit. The two-dimensional design includes a first layout for alignment features and semiconductor structures to be formed on a first surface of a first chiplet and a second layout for alignment features and semiconductor structures to be formed on a first surface of a second chiplet. The second chiplet is adjacent to the first chiplet on the semiconductor substrate. The second layout is a mirror image of the first layout across a reference line shared by the first chiplet and the second chiplet. The first surface of the first chiplet and the first surface of the second chiplet are both either top surfaces or bottom surfaces. The method further includes generating a photomask according to the design.

20 Claims, 8 Drawing Sheets

(51) Int. Cl.
  *H01L 23/528* (2006.01)
  *H01L 25/00* (2006.01)
  *H01L 25/065* (2006.01)
  *G03F 1/42* (2012.01)

(52) U.S. Cl.
  CPC ........ *H01L 25/0657* (2013.01); *H01L 23/528* (2013.01); *H01L 2225/06565* (2013.01)

(56) References Cited

U.S. PATENT DOCUMENTS

| | | |
|---|---|---|
| 2018/0042110 A1 | 2/2018 | Cok |
| 2018/0102338 A1 | 4/2018 | McLellan |
| 2020/0182930 A1 | 6/2020 | Lal et al. |
| 2020/0194262 A1 | 6/2020 | Delacruz et al. |
| 2020/0194298 A1 | 6/2020 | Lu et al. |
| 2021/0066171 A1* | 3/2021 | Kim ........................ H01L 24/29 |

OTHER PUBLICATIONS

Derbyshire, "Stacking Logic On Logic," https://semiengineering.com/stacking-logic-on-logic/, Jul. 21, 2016, 5 pages.
Qualcomm, "3D VLSI: Next Generation 3D Integration Technology", www.qualcomm.com/research, 60 pages, 2014.
Pangracious et al., "Three-Dimensional Integration: A More Than Moore Technology", Three-Dimensional Design Methodologies for Tree-based FPGA Architecture, 2015, 30 pages.

\* cited by examiner

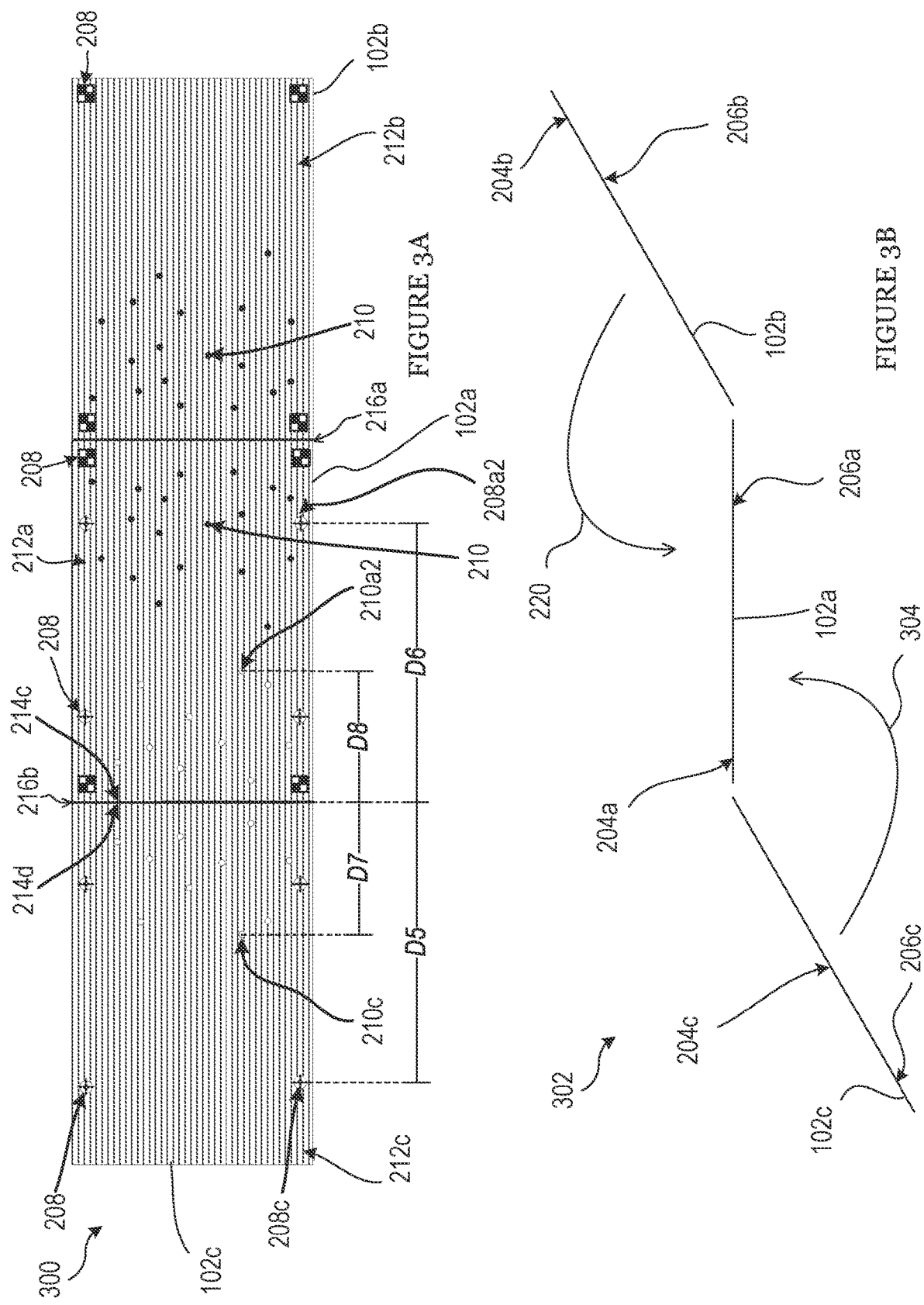

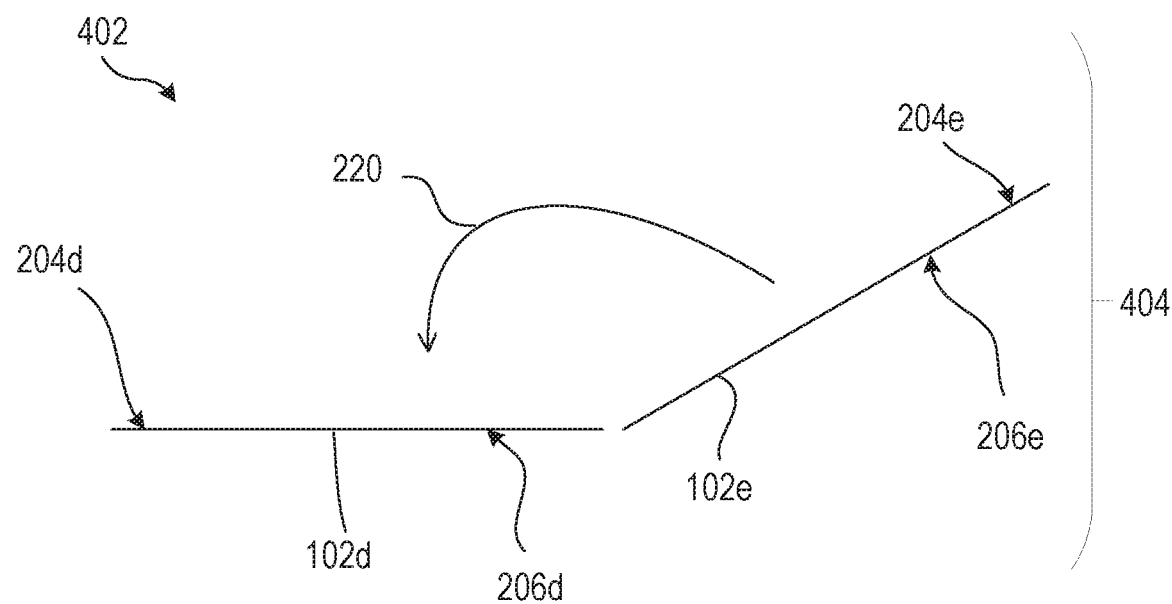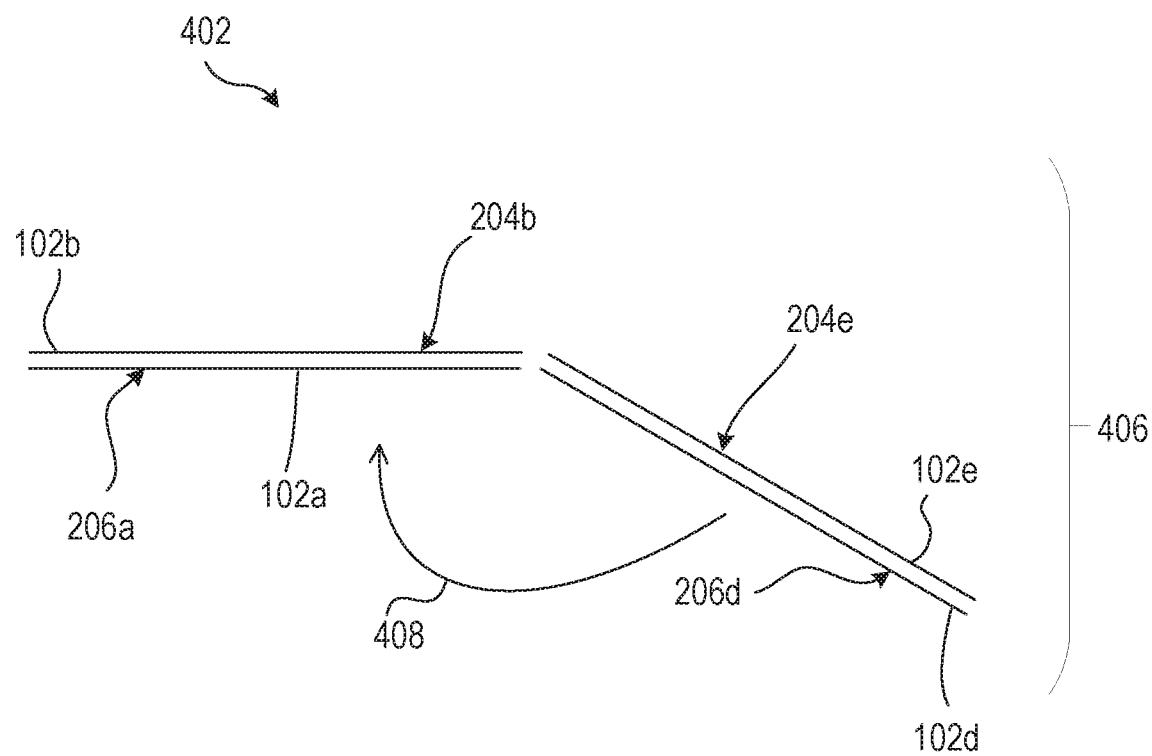
FIGURE 4C

FACILITATING ALIGNMENT OF STACKED CHIPLETS

CROSS-REFERENCE TO RELATED APPLICATIONS

This application claims the benefit of U.S. Provisional Application No. 62/896,633, filed on Sep. 6, 2019, which is incorporated by reference.

TECHNICAL FIELD

This disclosure relates generally to microelectronic devices, and, in certain embodiments, to facilitating alignment of stacked chiplets.

BACKGROUND

Manufacturing a semiconductor device, including on the microscopic scale, involves executing various fabrication processes, such as film depositions, etch mask creation, patterning, material etching and removal, and doping treatments, repeatedly to form semiconductor device elements on a substrate. Historically, with microfabrication, transistors have been created in one plane, with wiring/metallization formed above the active device plane, and have thus been characterized as two-dimensional (2D) semiconductor circuits formed using 2D fabrication. Scaling efforts have increased the number of transistors per unit area in 2D semiconductor circuits, but scaling efforts encounter challenges as scaling enters single digit nanometer fabrication nodes. Semiconductor device fabricators have expressed a desire for three-dimensional (3D) semiconductor circuits in which transistors are stacked on top of each other.

SUMMARY

In certain embodiments, a method for fabricating a semiconductor device includes forming chiplets on a substrate. Each chiplet has a first surface on a first side of the chiplet and a second surface on a second side of the chiplet. First and second chiplets are formed adjacent to each other on the substrate along first edges of the first and second chiplets. The first and second chiplets share a reference line across which alignment features and semiconductor structures on the first surface of the first chiplet are mirrored on the first surface of the second chiplet. The method includes separating the first and second chiplets from the substrate and aligning the first and second chiplets such that the first surfaces of the first and second chiplets face each other. The method includes bonding the first chiplet to the second chiplet, as aligned, to form at least a portion of a vertical stack of a multi-chip integrated circuit. The first and second chiplets are component levels in the vertical stack.

In certain embodiments, a method for fabricating a semiconductor device includes generating one or more photomasks made from a 2D design for fabricating chiplets on a semiconductor substrate. The chiplets are component levels for a multi-chip integrated circuit. The 2D design includes a first layout for first alignment features and first semiconductor structures to be formed on a first surface of a first chiplet and a second layout for second alignment features and second semiconductor structures to be formed on a first surface of a second chiplet. The first and second chiplets are adjacent on the substrate, and the second layout is a mirror image of the first layout across a reference line shared by the first and second chiplets. The first surfaces of the first and second chiplets are both either top or bottom surfaces. The method includes forming the chiplets using the one or more photomasks such that the first surface of the first chiplet includes the first alignment features and the first semiconductor structures arranged according to the first layout and the first surface of the second chiplet includes the second alignment features and the second semiconductor structures arranged according to the second layout.

In certain embodiments, a method for designing a semiconductor device includes generating a 2D design for fabricating chiplets on a substrate. The chiplets are component levels for a multi-chip integrated circuit. The 2D design includes a first layout for alignment features and semiconductor structures to be formed on a first surface of a first chiplet and a second layout for alignment features and semiconductor structures to be formed on a first surface of a second chiplet. The first and second chiplets are adjacent on the substrate. The second layout is a mirror image of the first layout across a reference line shared by the first and second chiplets. The first surfaces of the first and second chiplets are both either top or bottom surfaces. The method further includes generating one or more photomasks according to the design.

BRIEF DESCRIPTION OF THE DRAWINGS

For a more complete understanding of this disclosure, and the advantages thereof, reference is now made to the following descriptions taken in conjunction with the accompanying drawings, in which:

FIGS. 3A-3B illustrate an example 2D chiplet design and alignment process for a three-chiplet vertical stack of a multi-chip IC, according to certain embodiments;

FIGS. 4A-4C illustrate an example 2D chiplet design and alignment process for a four-chiplet vertical stack of a multi-chip IC, according to certain embodiments;

DETAILED DESCRIPTION OF ILLUSTRATIVE EMBODIMENTS

Figure 1:
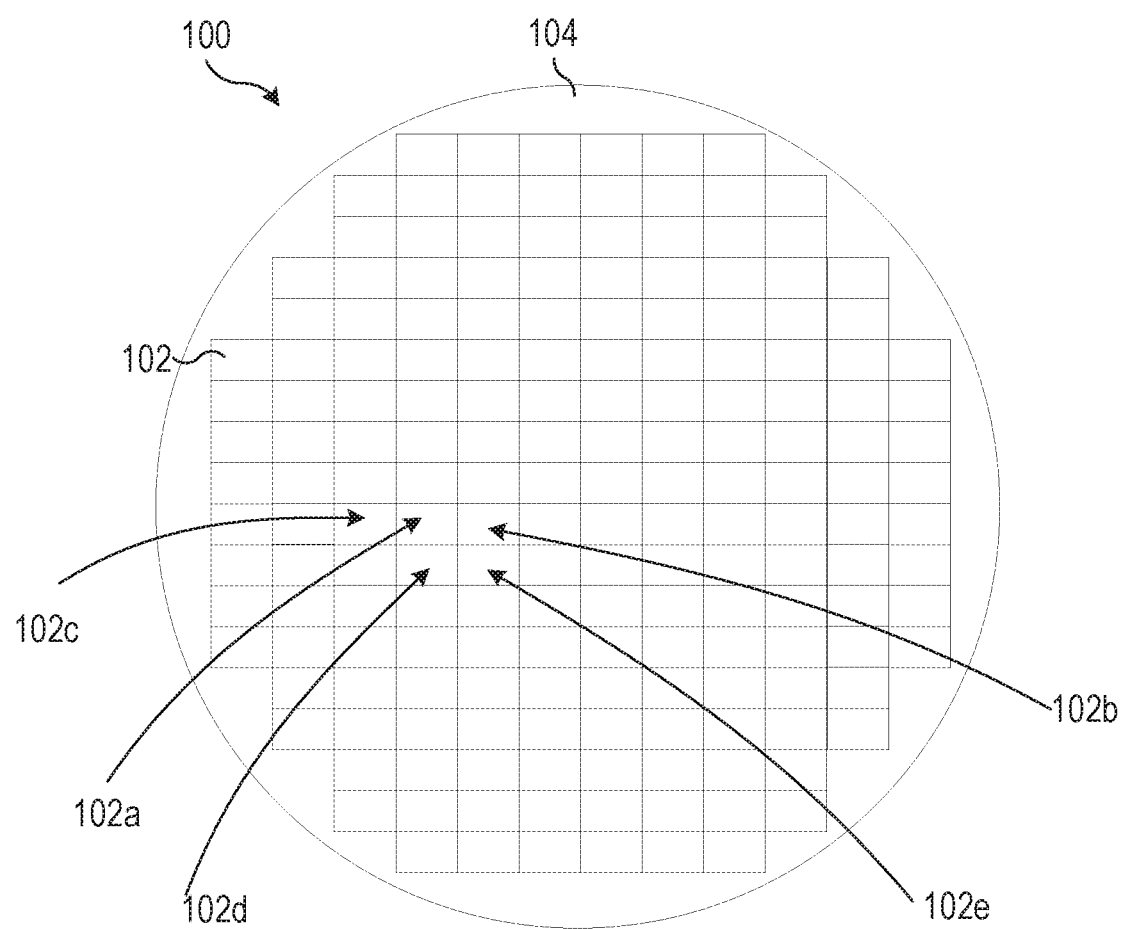
FIG. 1 illustrates an example semiconductor wafer that includes multiple chiplets formed on a substrate, according to certain embodiments.

Vertical stacking of devices, or 3D integration, aims to overcome scaling limitations of planar devices by increasing transistor density in volume rather than area. Although some 3D NAND devices use device stacking (e.g., monolithic 3D integration), application to random logic designs is harder because random logic circuits typically lack the repeating patterns associated with memory chips and should accommodate many different standard cells for specialized functions. Additionally, production-ready design tools for logic fabrication in 3D are lacking.

Furthermore, 3D monolithic integration processing involves performance-reducing compromises. Vertical fabrication for high performance transistors replaces the current manufacturing paradigm with a scheme that uses difficult line-of-sight doping and etch processes for forming source/drain regions and contacts. Also, to accommodate wiring, at least 3-4 levels of logic are fabricated to achieve desired scaling, presenting economic headwinds.

Another path to 3D processes is a complimentary field effect transistor (CFET) scheme that involves stacking p-channel FET (PFET) wires on n-channel FET (NFET) wires (or vice versa). CFETs provide a node of logic scaling for certain regular memory structures. Random logic circuits would gain less scaling to accommodate wiring for different standard cells. Even with a performance and scaling benefit for CFETs relative to horizontal nanowire FETs, CFETs provide only a node of scaling while making the devices more difficult to scale.

CFETs use a relaxed contacted poly pitch (CPP), which may increase transistor delay. While a relaxed CPP allows future CPP scaling, contacts to potentially two gates and four contacts should be accommodated, creating a lower limit to the volume scalability of gates and sources/drains. Thus, a minimum CPP for CFET may be larger than for a single N/P-FET. Stacking CFETs with wiring between layers introduces new challenges with a harder-to-scale stacked device. Alternatively, transistors can be scaled to a limit and then stacked. A horizontal nanowire PFET stacked over a horizontal nanowire NFET, both at the limit of scaling, has a smaller area than a CFET at the current scaling limit. Thus, areal density from stacking can be higher than with CFET, and the vertical direction is available area for scaling, so doubling the number of layers one time is not a costly detriment when numerous layers are used. Due to complex manufacturing for fabricating CFET devices, increased device critical dimensions (CDs) are expected, which may offset the one-time areal scaling benefit to adopting CFETs.

An alternative to building vertical transistors is to stack logic transistors in layers with wiring between the layers. Stacking may include building a layer as a wafer of chips, placing a single-crystalline silicon (Si) wafer on top of the pre-built logic, and building a second layer over the first layer, lithographically aligned with the first layer. While providing lithographic alignment, this process repeatedly subjects bottom layers to the full thermal budget of upper layers, which may compromise performance of the bottom layers. Fabricating upper layers using a lower thermal budget compromises performance of devices in the upper layers.

Alternatively, logic cores could be built as chiplets, with the logic fabricated in a high temperature device flow, stacked into a logic multi-chip IC with technology adapted from system on a chip (SOC) and system in package (SiP) fabrication. A single logic core that is a composite of vertically-stacked chiplets may be formed. A chiplet may refer to a complete subsystem intellectual property (IP) core, a reusable unit of logic, on a single die or part of single die. The chiplets may be fabricated using a planar logic process flow as a single die (or part of a single die) on a wafer, which is cut into individual chiplets prior to stacking. Stacking chiplets may reduce the number of metal layers to those used for core interconnect, and the global interconnect may be implemented similarly to fan-out packaging on a separate substrate.

Chiplet-stacking avoids compromising logic device performance with a non-ideal manufacturing process and is a direct extension of current device manufacturing and scaling paradigms. With chiplet-stacking, complementary metal-oxide-semiconductor (CMOS) devices can continue to scale in planar areal fabrication. Devices may be migrated to horizontal nano-sheet and eventually nano-wire configurations to continue the current scaling path. Chiplet-stacking may provide a relatively low cost alternative for improving performance by lowering interconnect line lengths overall, and can decrease system volume and energy use.

Chiplet-stacking, though, presents difficulties, including heat dissipation and aligning and bonding of chiplets. Fabrication process variability from chiplet to chiplet presents alignment challenges, which may limit the number and density of interconnections. Scaling benefits may be achieved using micro-through-silicon via (TSV) processes for inter-chiplet stacking, and improved alignment technologies may further improve scaling. As alignment approaches the level of scaled feature sizes, however, process variability between chiplets of a stacked multi-chip device may be a limiting factor. Another challenge with chiplet stacking is chiplet bonding. For device integrity and reliability, maintaining a low thermal budget is desirable, but low temperature (e.g., <400° C.) bonding processes are immature. A chiplet-stacking approach might use only a few metal layers for interconnects, and a refractory metal interconnect (e.g., with ruthenium) that can withstand higher temperatures than conventional copper barrier/seed technology might be used.

Certain embodiments of this disclosure provide techniques to create vertically-stacked multi-chip devices with minimal alignment errors from layer to layer using a 2D projection process that can be adapted into design algorithms. With certain embodiments, chiplets for a stacked multi-chip device are fabricated as a single die or part of a single die within a logic process flow.

FIG. 1 illustrates an example semiconductor wafer 100 that includes multiple chiplets 102 formed on a substrate 104, according to certain embodiments. Semiconductor wafer 100 may include any suitable number of chiplets 102. Each chiplet 102 may be a chip, an IC die, a portion of an IC die, a semiconductor device, a passive or active device, an interconnect, another type of device, or the like. In certain embodiments, each chiplet 102 is a self-contained unit designed to perform particular functions in a larger multi-chip device. For example, each chiplet 102 may be a logic device, memory device, or another suitable type of device. The types of chiplets 102 on semiconductor wafer 100 may vary. Chiplets 102 may have any suitable dimensions. Chiplets 102 are component levels for a multi-chip IC in which component levels, or decks, are aligned in a vertical stack and bonded together. The vertical stacks may include two or more chiplets 102, each chiplet 102 performing particular operations for the multi-chip IC.

Substrate 104 may include any suitable type of substrate appropriate for use in forming chiplets 102. For example, substrate 104 may be a bulk silicon wafer platform suitable for high performance logic fabrication. With wafer thinning from the back side, a bulk substrate can be used. Silicon on insulator (SOI) and fully depleted SOI (FDSOI) substrates may be used to fabricate chiplets 102 due to the buried oxide layers already present in those substrates. In addition, for monolithic 3D logic (M3DL) technology operating at scale, heat dissipation techniques may counteract self-heating. Engineered SOI and FDSOI wafers with built-in heat spreading layers may facilitate device cooling in a 3D structure. Heat conducting insulators such as diamond or hexagonal boron nitride may be used as such heat spreading layers under device layers. In this example, a stacked IC with back-to-back bonding produces logic devices sandwiched around heat spreading layers, providing a suitable structure for counteracting self-heating of the devices. Other embodiments can be fabricated using non-silicon elements or silicon alloys as the active layer for the devices. For example, germanium (Ge), silicon Ge (SiGe), III-V or other active channel layers may be accommodated given appropriate substrates.

Chiplets 102 are designed and formed according to techniques described herein. Five particular chiplets, chiplets 102a-102e, are individually labeled and referenced below in connection with describing other figures. Once formed, chiplets 102 may be separated from substrate 104 and, as described further below, selected chiplets 102 may be aligned in a vertical stack and bonded together to form a portion of a multi-chip IC.

Figure 2A:
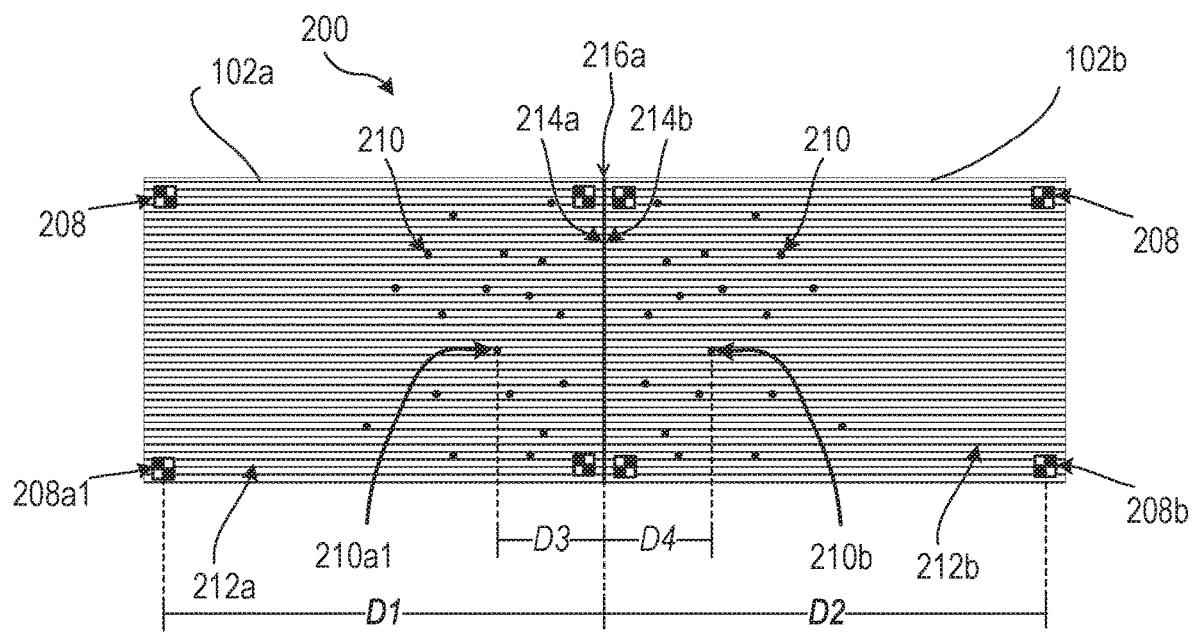
FIGS. 2A-2B illustrate an example 2D chiplet design and alignment process for a two-chiplet vertical stack of a multi-chip IC, according to certain embodiments.
Figure 2B:
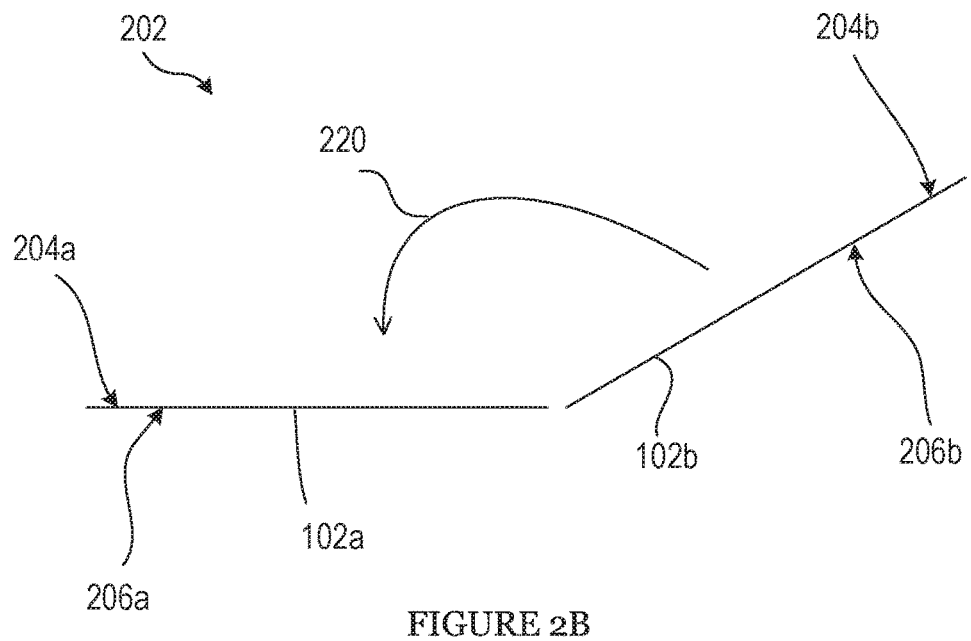

FIGS. 2A-2B illustrate an example 2D chiplet design 200 and alignment process 202 for a two-chiplet vertical stack of a multi-chip IC, according to certain embodiments. In general, 2D chiplet design 200 projects locations of elements of chiplet 102a to adjacent chiplet 102b, which ultimately may be positioned above or below chiplet 102a in a multi-chip IC. For purposes of this disclosure, two chiplets 102 described as adjacent are side-by-side without an intervening chiplet 102 between the two chiplets 102. Throughout this disclosure, particular instances of certain elements are referenced using the format ###a, ###b, and so on (e.g., chiplet 102a), and those elements also may be referred to generically just using the format ### (chiplet 102), whether or not a generic instance is labeled in a figure.

Chiplet 102a includes surface 204a and surface 206a, and chiplet 102b includes surface 204b and surface 206b. Surfaces 204 may be considered faces or top-side surfaces of chiplets 102a and 102b. Surfaces 206 may be considered backs or backside surfaces of chiplets 102a and 102b. When chiplets 102a and 102b are formed on substrate 104, surfaces 206 face substrate 104. Chiplets 102a and 102b are designed to be arranged in a two-chiplet vertical stack of a multi-chip IC, with surface 204a of chiplet 102a facing surface 204b of chiplet 102b. Throughout this disclosure, when arranged such that surface 204 of one chiplet 102 will face surface 204 of another chiplet 102, those chiplets 102 are described as being oriented face-to-face (F2F). When arranged such that surface 206 of one chiplet 102 will face surface 206 of another chiplet 102, those chiplets 102 are described as being oriented back-to-back (B2B).

Chiplet 102a includes alignment features 208 and semiconductor structures 210 arranged in a first layout on surface 204a of chiplet 102a. Alignment features 208 facilitate physically aligning chiplets 102 in a vertical stack. Alignment features may have any suitable size, shape, placement, and form, and may be designed and placed arbitrarily. Semiconductor structures 210 include semiconductor elements intended to be aligned with corresponding semiconductor structures 210 on a surface of another chiplet 102 (chiplet 102b in this example) to be arranged in a vertical stack with chiplet iota. Semiconductor structures 210 may include any suitable structures. In certain embodiments, semiconductor structures 210 include structures for conductively coupling chiplets 102a and 102b. For example, semiconductor structures 210 may include vias, such as TSVs and/or contacts, bond pads, or other suitable vias.

Chiplet 102a includes interconnects 212a, which in the illustrated example are unidirectional. In certain embodiments, interconnects 212 include at least a portion of the metal interconnect structures of a given chiplet 102. Furthermore, although shown for purposes of designing chiplets 102, interconnects 212 might not actually be visible if viewing a surface 204/206 of a physical chiplet 102. Instead interconnects 212 may be contacted using one or more of the semiconductor structures 210 of a given chiplet 102. Interconnects 212 may include metallization layers (M1 layer, M2 layer, and so on) of a given chiplet 102.

Chiplet 102b includes alignment features 208 and semiconductor structures 210 arranged in a second layout on surface 204b of chiplet 102b, and also includes interconnects 212b (also unidirectional like interconnects 212a in this example), which are analogous to like-numbered structures of chiplet 102a.

In the design stage of FIG. 2A and when chiplets 102a and 102b are formed on substrate 104 (FIG. 1), chiplets 102a and 102b are adjacent to each other along an edge 214a of chiplet 102a and an edge 214b of chiplet 102b. When aligning chiplets 102a and 102b to form a vertical stack of a multi-chip IC, it is desirable for alignment features 208 and semiconductor structures 210 on surface 204a of chiplet 102a to align with corresponding alignment features 208 and semiconductor structures 210, respectively, on surface 204b of chiplet 102b.

To produce chiplets 102 that have minimal alignment errors, rather than copying the first layout of alignment features 208 and semiconductor structures 210 on surface 404a of chiplet 102a to surface 404b of chiplet 102b (or to another chiplet 102 elsewhere on semiconductor wafer 100 or on another semiconductor wafer), 2D chiplet design 200 uses a mirror image of the first layout of chiplet 102a. Chiplets 102a and 102b, share reference line 216a, located at the midpoint between edge 214a of chiplet 102a and edge 214b of chiplet 102b. According to 2D chiplet design 200, alignment features 208 and semiconductor structures 210 on surface 204a of chiplet 102a are mirrored across reference line 216a to surface 204b of chiplet 102b. In other words, the second layout on surface 204b mirrors the first layout on surface 204a.

Due to this mirrored relationship, and considering example alignment feature 208a1 and semiconductor structure 210a1 on surface 204a of chiplet 102a and example alignment feature 208b and semiconductor structure 210b on surface 204b of chiplet 102b, a distance D1 from alignment feature 208a1 to reference line 216a is substantially equal to a distance D2 from alignment feature 208b to reference line 216a, and a distance D3 from semiconductor structure 210a1 to reference line 216a is substantially equal to a distance D4 from semiconductor structure 210b to reference line 216a.

One technique for mirroring the layout of alignment features 208 and semiconductor structures 210 on surface 204a of chiplet 102a on surface 204b of chiplet 102b, is to project the alignment features 208 and semiconductor structures 210 on surface 204a of chiplet 102a onto surface 204b of chiplet 102b using a design tool. Again referring to example alignment feature 208a1, the distance D1 from alignment feature 208a1 to reference line 216a may be determined and then doubled to project the position of alignment feature 208a1 onto surface 204b of chiplet 102b for placement of alignment feature 208b on surface 204b of chiplet 102b. Similarly, the distance D3 from example semiconductor structure 210a1 to reference line 216a may be determined and then doubled to project the position of semiconductor structure 210a1 onto surface 204b of chiplet 102b for placement of semiconductor structure 210b on surface 204b of chiplet 102b. Although this technique for mirroring is described, this disclosure contemplates alignment features 208 and semiconductor structures 210 on surface 204a of chiplet 102a being mirrored across reference line 216a on surface 204b of chiplet 102b in any suitable manner.

Once chiplets 102a and 102b are formed on substrate 104 according to 2D chiplet design 200, chiplets 102a and 102b may be removed from substrate 104 and aligned according to alignment process 202 shown in FIG. 2B. For example, to align chiplets 102a and 102b, and thereby align alignment features 208 and semiconductor structures 210 on surface 204a with mirrored alignment features 208 and semiconductor structures 210 on surface 204b, as shown by arc 220, chiplet 102b may be folded, or pivoted, about the location where reference line 216a existed in the design process. Of course, in an actual implementation rather than pivoting chiplet 102b about the location of reference line 216a, chiplets 102a and 102b may be moved in various positions until chiplet 102a and 102b are aligned as if chiplet 102b had been pivoted about the reference line 216a.

Once chiplets 102a and 102b are aligned, surface 204a of chiplet 102a faces surface 204b of chiplet 102b, which may be considered an F2F stacking approach. Alternatively, a B2B stacking approach can be implemented, if desired. In such an embodiment, alignment features 208 and semiconductor structures 210 are formed on surfaces 206a and 206b of chiplets 102a and 102b, respectively, pivoting/folding of chiplets 102a and 102b would occur in an opposite direction, and surfaces 206a and 206b would face one another once chiplets 102a and 102b are aligned. In certain embodiments, F2F stacking may allow for a higher density and number of connections between chiplets 102a and 102b (e.g., through semiconductor structures 210, such as vias), while B2B stacking may have fewer connections (e.g., through semiconductor structures 210, such as vias) due to the lack of devices in TSV zones.

As described above, semiconductor structures 210 on surface 204a of chiplet 102a and surface 204b of chiplet 102b may include vias for connections between chiplet 102a and 102b. Those vias may lead to one or more metallization layers internal to chiplets 102a and 102b or could be TSVs that extend entirely through chiplet 102a and/or chiplet 102b.

In one example, chiplets 102a and 102b are configured such that chiplet-to-chiplet connections are made at a metallization layer at a second metallization level, which may be referred to as the M2 layer. Semiconductor structures 210 (e.g., vias) may be fabricated on both chiplets 102a and 102b and used to connect the M2 layer of chiplet 102a to the M2 layer of chiplet 102b. The M2 layer (or any other metallization layers) can be fabricated using conventional single exposure lithography, or may be fabricated using multiple patterning.

Alignment features 208 can be incorporated into chiplets 102a and 102b at the same level of the semiconductor structures 210 (e.g., vias), at a level below level of the semiconductor structures 210 (e.g., vias), or at any suitable location. In certain embodiments, alignment features 208 are fabricated simultaneously using a single mask for all of chiplets 102 to be formed into a vertical stack (e.g., in chiplets 102a and 102b, in the example of FIGS. 2A-2B).

FIGS. 3A-3B illustrate an example 2D chiplet design 300 and alignment process 302 for a three-chiplet vertical stack of a multi-chip IC, according to certain embodiments. The vertical stack of chiplets 102 contemplated by 2D chiplet design 300 includes chiplets 102a and 102b facing each other in a F2F orientation, and chiplets 102a and 102c facing each other in a B2B arrangement. The relative design and arrangement for chiplets 102a and 102b are the same as the relative design and arrangement described above with reference to FIGS. 2A-2B and is not repeated.

Chiplet 102a further includes alignment features 208 and semiconductor structures 210 arranged in a third layout on surface 206a of chiplet 102a. Alignment features 208 on surface 206a of chiplet 102a are shown as having a different form and location from alignment features 208 on surface 204a of chiplet 102a for ease of distinguishing these alignment features 208 but may be the same or different as appropriate for a given application. Additionally, semiconductor structures 210 on surface 206a of chiplet 102a are shown as white dots (rather than black dots) to demonstrate that are on a different surface of chiplet 102a than semiconductor structures 210 on surface 204a of chiplet 102a.

Chiplet 102c includes alignment features 208 and semiconductor structures 210 arranged in a fourth layout on surface 206c of chiplet 102c, and also includes interconnects 212c (also unidirectional like interconnects 212a and 212b in this example), which are analogous to like-numbered structures of chiplets 102a and 102b. In the design stage of FIG. 3A and when chiplets 102a and 102c are formed on substrate 104 (FIG. 1), chiplets 102a and 102c are adjacent to each other along an edge 214c of chiplet 102a and an edge 214d of chiplet 102c.

When aligning chiplets 102a and 102c to form a vertical stack of a multi-chip IC, it is desirable for alignment features 208 and semiconductor structures 210 on surface 206a of chiplet 102a to align with corresponding alignment features 208 and semiconductor structures 210, respectively, on surface 206c of chiplet 102c. According to 2D chiplet design 300, alignment features 208 and semiconductor structures 210 on surface 206a of chiplet 102a are mirrored across a shared reference line 216b (located at the midpoint between edge 214c of chiplet 102a and edge 214d of chiplet 102c) to surface 206c of chiplet 102c. In other words, the fourth layout on surface 206c mirrors the third layout on surface 206a.

Due to this mirrored relationship, and considering example alignment feature 208a2 and semiconductor structure 210a2 on surface 206a of chiplet 102a and example alignment feature 208c and semiconductor structure 210c on surface 206c of chiplet 102c, a distance D5 from alignment feature 208a2 to reference line 216b is substantially equal to a distance D6 from alignment feature 208c to reference line 216b, a distance D8 from semiconductor structure 210a2 to reference line 216b is substantially equal to a distance D7 from semiconductor structure 210c to reference line 216b. An example technique for mirroring a layout is described above with reference to FIGS. 2A-2B and is not repeated. This disclosure contemplates alignment features 208 and semiconductor structures 210 on surface 206a of chiplet 102a being mirrored across reference line 216b on surface 206c of chiplet 102c in any suitable manner.

Once chiplets 102a-102c are formed on substrate 104 according to 2D chiplet design 300, chiplets 102a-102c may be removed from substrate 104 and aligned according to alignment process 302 shown in FIG. 3B. For example, chiplets 102a and 102b may be aligned as described above with reference to FIGS. 2a-2b. As another example, to align chiplets 102a and 102c, and thereby align alignment features 208 and semiconductor structures 210 on surface 206a with mirrored alignment features 208 and semiconductor structures 210 on surface 206c, as shown by arc 304, chiplet 102c may be folded, or pivoted, about the location where reference line 216b existed in the design process.

In one example of 2D chiplet design 300, chiplets 102a and 102b are connected via semiconductor structures 210 to respective first metallization layers (at a first metallization level such as M4) and chiplets 102a and 102c are connected via semiconductor structures 210 to respective second metallization layers (at a second metallization level such as M2).

Although in the example 2D chiplet design 300 chiplets 102b and 102c are positioned on opposite sides of chiplet 102a, chiplet 102c could be positioned on an adjacent side of chiplet 102a to chiplet 102b. An example of how such an arrangement would be configured will be apparent from the example described below regarding FIGS. 4A-4C.

Figure 4A:
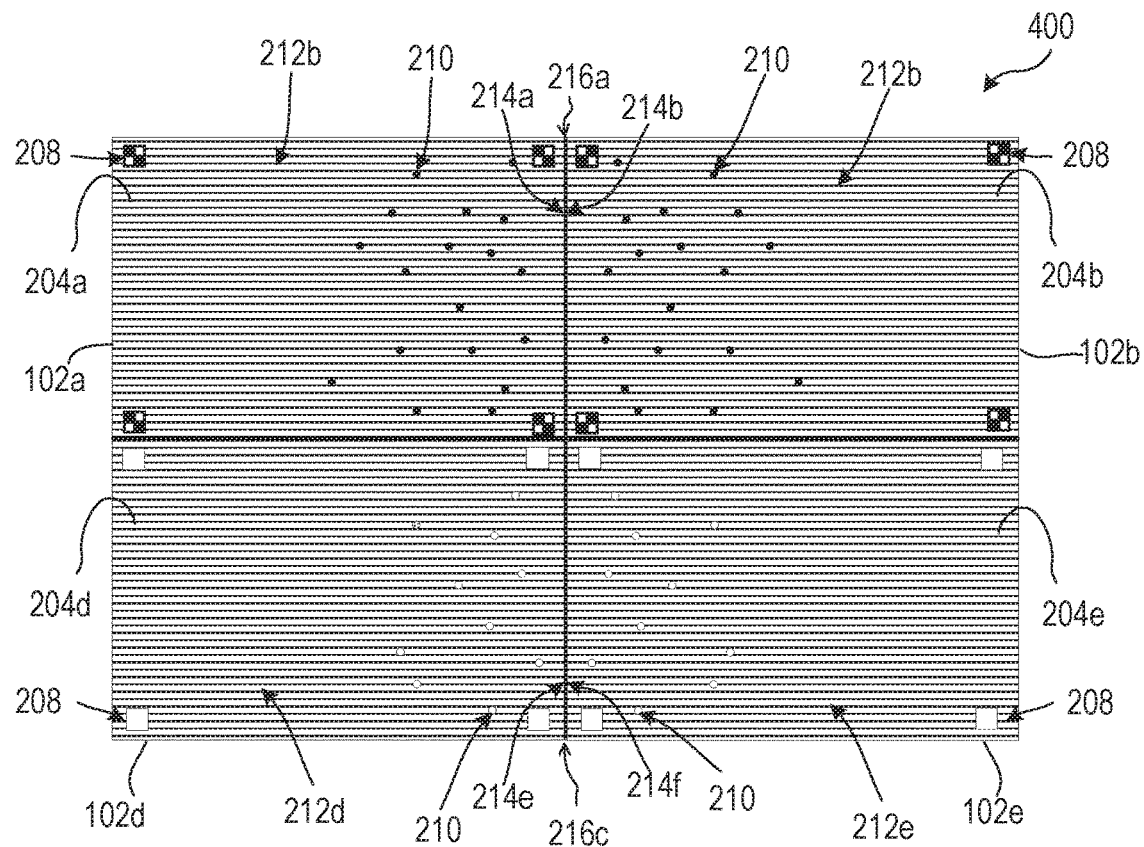
Figure 4B:
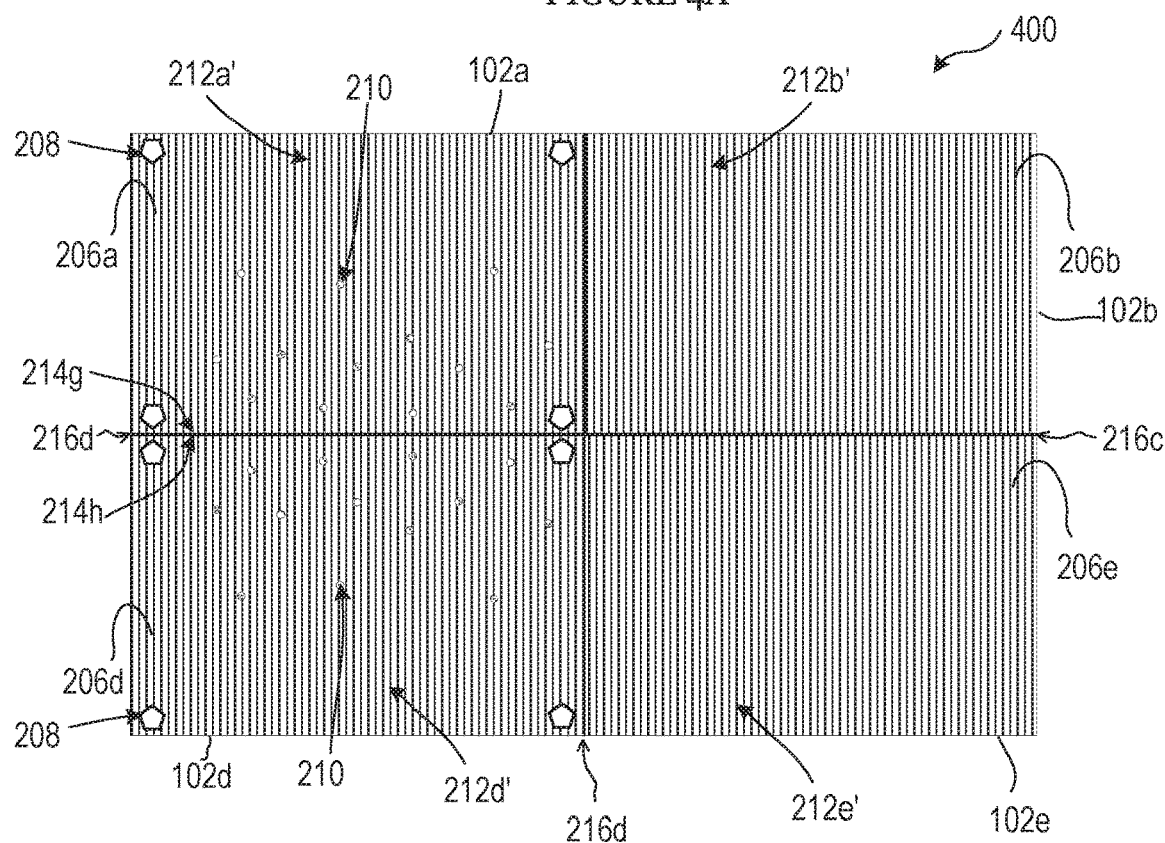

FIGS. 4A-4C illustrate an example 2D chiplet design 400 and alignment process 402 for a four-chiplet vertical stack of a multi-chip IC, according to certain embodiments. In particular, FIG. 4A illustrates 2D chiplet design 400 for two B2B chiplet 102 pairs of four chiplets 102 (chiplets 102a, 102b, 102d, and 102e), FIG. 4B illustrates 2D chiplet design 400 for one F2F chiplet pair of the four chiplets 102, and FIG. 4C illustrates alignment process 402. FIGS. 4A-4C illustrate an extension of the mirroring approach described above with reference to FIGS. 2A-2B and 3A-3B, and the mirroring details are incorporated by reference but not repeated.

In the design stage of FIGS. 4A-4B and when chiplets 102d and 102e are formed on substrate 104 (FIG. 1), chiplet 102d is adjacent to chiplet 102e along an edge 214e of chiplet 102d and an edge 214f of chiplet 102e. Chiplet 102f includes alignment features 208 and semiconductor structures 210 arranged in a fifth layout on surface 204d of chiplet 102d. According to 2D chiplet design 400, alignment features 208 and semiconductor structures 210 on surface 204d of chiplet 102d are mirrored across reference line 216c (located at the midpoint between edge 214e and edge 214f) to surface 204e of chiplet 102e. In other words, a sixth layout of alignment features 208 and semiconductor structures 210 on surface 204e mirrors the fifth layout on surface 204d.

In the design stage of FIGS. 4A-4B and when chiplets 102e and 102f are formed on substrate 104 (FIG. 1), chiplet 102d is adjacent to chiplet 102a along an edge 214g of chiplet 102a and an edge 214h of chiplet 102d. Chiplet 102a includes alignment features 208 and semiconductor structures 210 arranged in a seventh layout on surface 204d of chiplet 102a. For purposes of this example, as illustrated the seventh layout on surface 204d of chiplet 102a is different than the third layout on surface 204d of chiplet 102a described above with reference to FIG. 2A. According to 2D chiplet design 400, alignment features 208 and semiconductor structures 210 on surface 206a of chiplet 102a are mirrored across reference line 216d (located at the midpoint between edge 214g and edge 214h) to surface 206d of chiplet 102d. In other words, an eighth layout of alignment features 208 and semiconductor structures 210 on surface 206d mirrors the seventh layout on surface 206a.

Once chiplets 102a-102b and 102d-102e are formed on substrate 104 according to 2D chiplet design 400, chiplets 102a-102b and 102d-102e may be removed from substrate 104 and aligned according to alignment process 402 (FIG. 4B). To form the four-chiplet vertical stack, as shown at stage 404 of alignment process 402, chiplet 102b is aligned with chiplet 102a such that surface 204b faces surface 204a, and chiplet 102e is aligned with chiplet 102d such that surface 204e faces surface 204d. For example, chiplets 102a and 102b may be aligned as described above with reference to FIGS. 2a-2B. Chiplets 102a and 102b are hidden in the cross-section view of stage 404. As another example, to align chiplets 102d and 102e, and thereby align alignment features 208 and semiconductor structures 210 on surface 204d with mirrored alignment features 208 and semiconductor structures 210 on surface 204e, as shown by arc 220, chiplet 102e may be folded, or pivoted, about the location where reference line 216c existed in the design process. This alignment results in two two-chiplet stacks, the first being chiplets 102a and 102b and the second being chiplets 102d and 102e. The aligned chiplets might be bonded together at this stage, or bonding may be performed later.

As shown at stage 406 of alignment process 402, the two two-chiplet stacks are aligned such that surface 206a faces surface 206d. To align chiplets 102a and 102d, and thereby align alignment features 208 and semiconductor structures 210 on surface 206a with mirrored alignment features 208 and semiconductor structures 210 on surface 206d (and create the four-chiplet stack), as shown by arc 408, chiplet 102d may be folded, or pivoted, about the location where reference line 216d existed in the design process. To illustrate this pivoting, the resulting structure of stage 404 was rotated 90°, revealing cross sections of the two two-chiplet stacks. The aligned chiplet stack may be bonded together. In the resulting four-chiplet stack, chiplets 102b and 102e are the outer chiplets, and chiplets 102a and 102d are the middle chiplets.

Although alignment process 402 was described in a particular order, aligning of the four chiplets 102a-102b and 102c-102d could be performed in any suitable order. While 2D chiplet design 400 uses an example of two F2F chiplet pairs (chiplets 102a and 102b and chiplets 102d and 102e) and one B2B chiplet pair (chiplets 102a and 102d), other arrangements may be used, such as two B2B chiplet pairs and one F2F chiplet pair in a four-chiplet stacked device.

In the illustrated example, chiplets 102d and 102e include interconnects 112d and 112e that are unidirectional in a same direction as interconnects 112a and 112b when viewing surfaces 204c and 204d of chiplets 102c and 102d. FIG. 4B illustrates a view of second surfaces 206a, 206b, 206d, and 206e. Chiplets 102a, 102b, 102d, and 102e include interconnects 112a', 112b', 112d', and 112e', respectively, which in this example are unidirectional and orthogonal to (in plan view) interconnects 112a, 112b, 112d, and 112e.

FIGS. 4A-4C further contemplate unidirectional interconnects running orthogonal to each other from one metal layer to the next (e.g., using a multiple patterning process), but diagonal, bi-directional, or even random interconnect structures can be used. For chiplets 102 that use both a F2F and a B2B alignment (e.g., chiplets 102a and 102d in the illustrated example), semiconductor structures 210 that are vias for B2B bonding may connect to a lower metal layer than the semiconductor structures 210 that are vias for F2F bonding. In certain embodiments, B2B bonding may use one or more vias that contact a buried power rail or buried interconnect lines embedded in the substrate beneath the active devices of chiplets 102.

Figure 5:
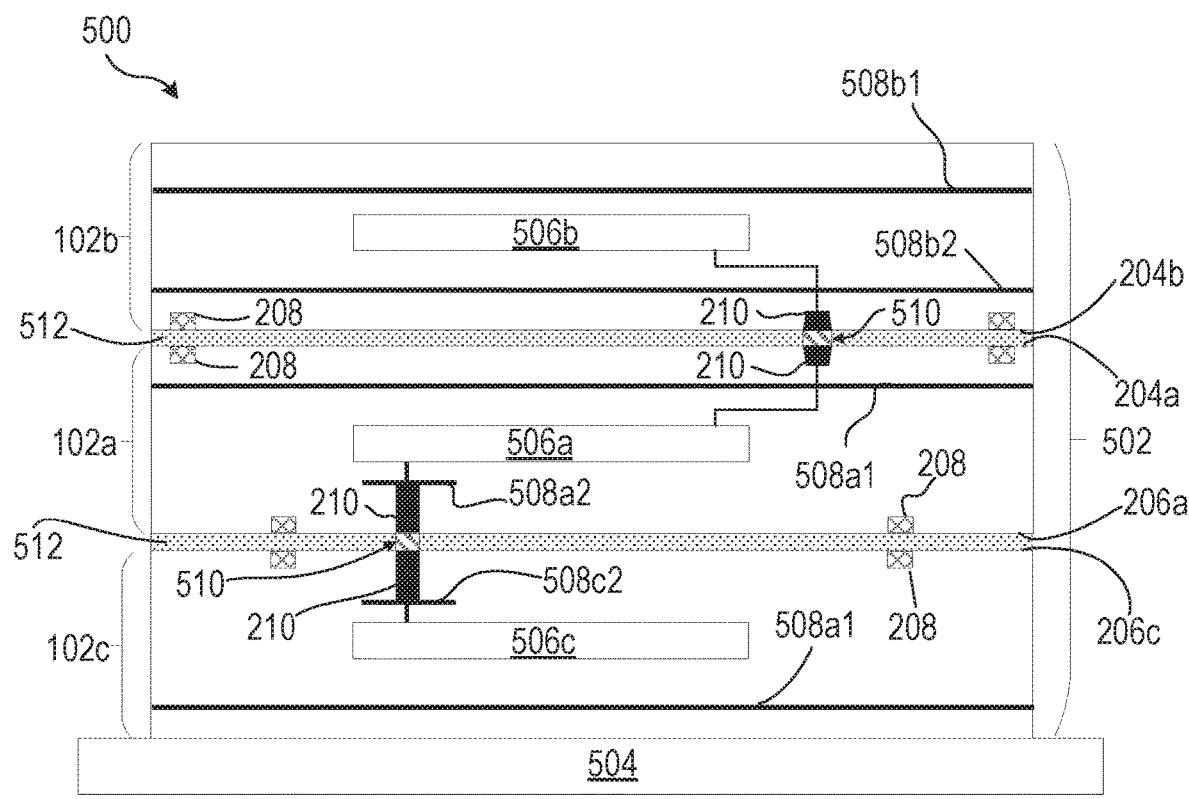
FIG. 5 illustrates a cross-sectional view of an example multi-chip IC having multiple chiplets aligned in a vertical stack, according to certain embodiments.

FIG. 5 illustrates a cross-sectional view of an example multi-chip IC 500 having multiple chiplets 102 aligned in a vertical stack 502, according to certain embodiments. Vertical stack 502 includes chiplets 102a-102c, and is positioned on a substrate 504. Substrate 504 encompasses any elements that might underlie vertical stack 502 in a multi-chip IC, including potentially an interposer layer (though a chiplet of vertical stack 502 may itself be an interposer layer), a package substrate, bonding elements, or any other suitable layers.

Each chiplet 102 of vertical stack 502 includes an active device 506 (active devices 506a, 506b, and 506c), and each chiplet 102 may include any suitable number of active devices 506. Active devices 506 may include, for example, a field effect transistor (FET). In certain embodiments, one or more of chiplets 102a-102c includes a layer of FETs.

Each chiplet 102 includes one or more metallization layers 508, which may correspond to interconnects 212, and may in part provide conductive connections to active devices 506. Chiplet 102a includes metallization layers 508a1 and 508a2, chiplet 102b, includes metallization layers 508b1 and 508b2, and chiplet 102c includes metallization layers 508c1 and 508c2. Each chiplet 102 includes any suitable number of metallization layers 508 at any suitable locations and orientations. One or more metallization layers 508 may be positioned "above" active devices 506 within a chiplet 102, and one or more metallization layers 508 may be positioned "below" active devices 506 within a chiplet 102.

As shown in FIG. 5, alignment features 208 on surface 204b of chiplet 102b, are aligned with alignment features 208 on surface 204a of chiplet 102a, and alignment features 208 on surface 206a of chiplet 102a are aligned with alignment features 208 on surface 206c of chiplet 102c. Additionally, semiconductor structures 210 on surface 204b of chiplet 102b are aligned with semiconductor structures 210 on surface 204a of chiplet 102a, and semiconductor structures 210 on surface 206a of chiplet 102a are aligned with semiconductor structures 210 on surface 206c of chiplet 102c. In the illustrated example, semiconductor structures 210 are vias.

A suitable bonding material 510 may be applied where aligned semiconductor structures 210 are located to complete a conductive connection between aligned semiconductor structures 210. Furthermore, a suitable bonding material 512 may be used between chiplets 102b and 102a and between chiplets 102a and 102c. As just a few examples, bonding material 510 and bonding material 512 may include any suitable combination of a ball grid array, microbumps, or other conductive materials having adhesive characteristics.

Although forming a global connection to substrate 504 or an entity outside multi-chip IC 500 is not described in detail, any suitable technique may be used for such global connections. For example, a TSV of chiplet 102b, (the top chiplet in vertical stack 502) may connect to a fan out multi-chip module or by soldering to a system chip. Additionally or alternatively, interconnect structures of chiplet 102c (the bottom chiplet in vertical stack 502) may be used for global interconnection. Such interconnect structures can be formed prior to chiplet dicing and bonding if the middle deck (e.g., chiplet 102a) and top deck (chiplet 102b) are masked during fabrication to protect their respective top layers. In certain embodiments, after forming multi-chip IC 500 having vertical stack 502 with multiple chiplets 102, multiple multi-chip ICs 500 can be mounted on a carrier substrates to form additional interconnect structures.

In certain embodiments, one or more chiplets 102 (e.g., a bottom chiplet) of a multi-chip IC may not contain logic devices (e.g., active devices 506) at all, and instead may be used solely for interconnect structures. Such an embodiment may provide increased flexibility in placement of vias (e.g., TSVs).

Figure 6:
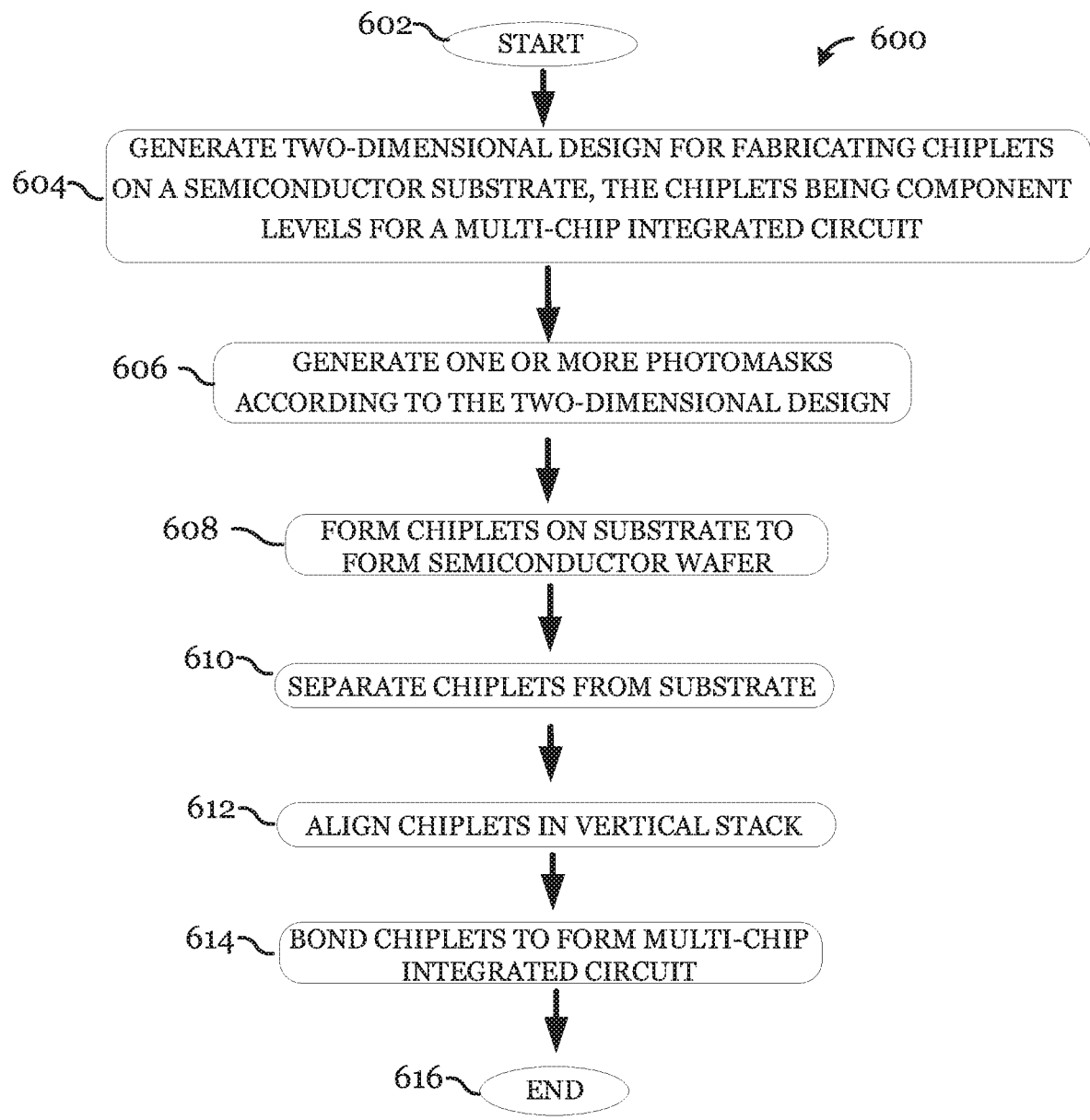
FIG. 6 illustrates an example method for designing and forming a semiconductor device, according to certain embodiments.

FIG. 6 illustrates an example method 600 for designing and forming a semiconductor device, according to certain embodiments. Method 600 begins at step 602. At step 604, a 2D chiplet design for fabricating chiplets 102 on a semiconductor substrate 104 is generated. The 2D chiplet design could be similar to 2D chiplet design 200, 300, or 400. At step 606, one or more photomasks may be generated according to the 2D chiplet design. For example, the one or more photomasks may be generated using a photomask writer. As examples, any of 2D chiplet designs 200/300/400 may be used to generate one or more photomasks to form appropriate chiplets 102 on substrate 104 of semiconductor wafer 100.

At step 608, chiplets 102 are formed on substrate 104 to form semiconductor wafer 100. For example, chiplets 102 may be formed using the one or more photomasks generated at step 606 and according to the 2D chiplet design generated at step 604. At step 610, chiplets 102 are separated from substrate 104. Chiplets 102 may be separated from substrate 104 using any suitable combination of chemical, mechanical, or other processes. For example, a release etch, such as an undercut etch, may be performed using an etchant (e.g., hydrofluoric acid (HF)) to partially or completely release chiplets 102 from substrate 104. As another example, separating chiplets 102 from substrate 104 could include dicing semiconductor wafer 100 such that some or all of substrate 104 that underlies a particular chiplet 102 remains with that chiplet 102.

At step 612, two or more chiplets 102 are aligned in a vertical stack. At step 614, chiplets 102 are bonded together to form at least a portion of multi-chip IC. Chiplets 102 may be bonded together using any suitable technique, such as using multiple microbumps and/or other bonding materials. Method 600 ends at step 616.

Figure 7:
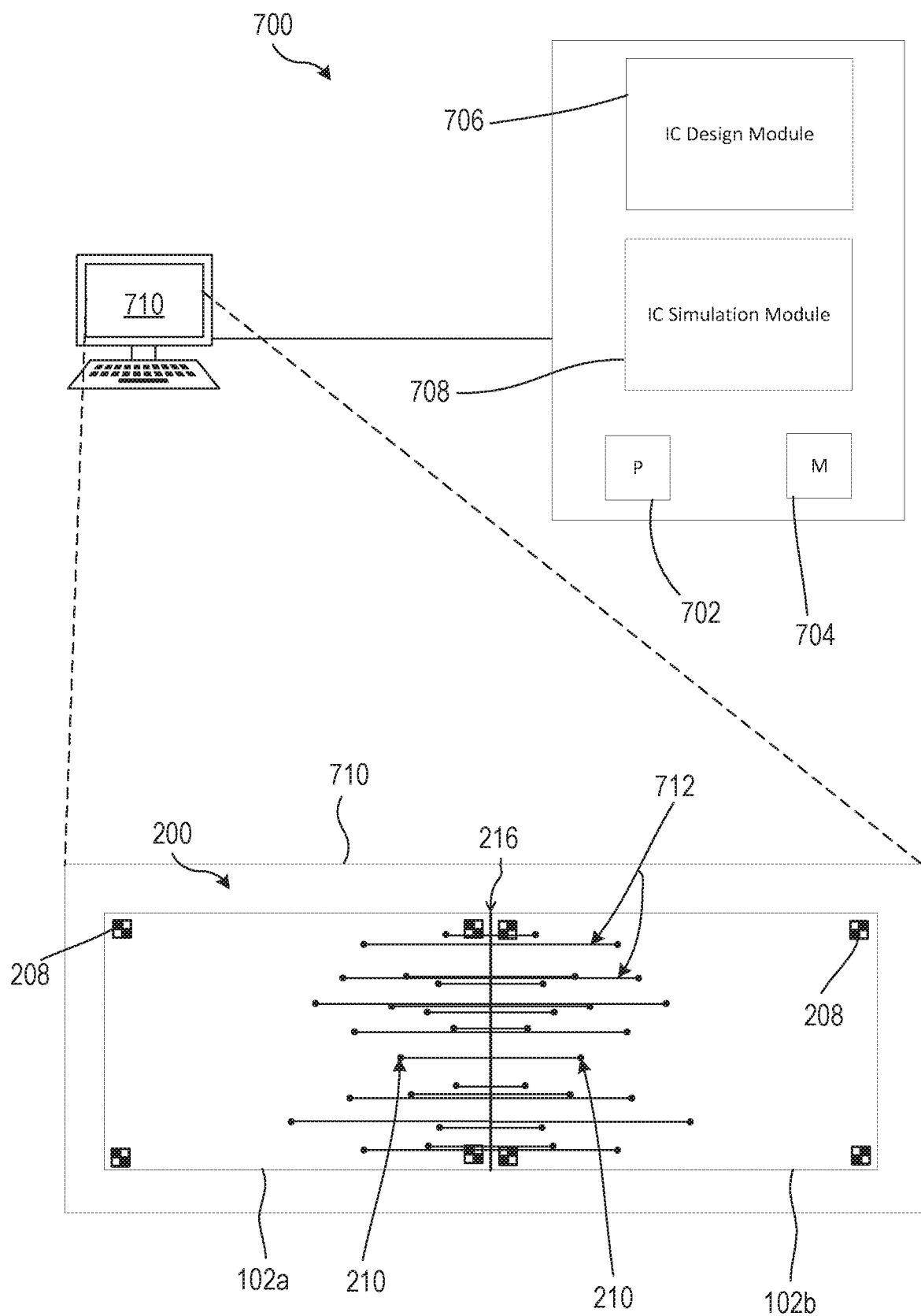
FIG. 7 illustrates an example computer system for designing and simulating operation of an IC, according to certain embodiments.

FIG. 7 illustrates an example computer system 700 for designing and simulating operation of an IC, according to certain embodiments. For example, computer system 700 may be used to design chiplets 102, including according to 2D chiplet designs 200/300/400.

Computer system 700 may be one or more electronic processing devices, such as a desktop or laptop computer, a tablet device, a smartphone, a wearable device, a server, or the like. Computer system 700 includes one or more processors 702 and memory 704. Processors 702 may include one or more microprocessors, controllers, or any other suitable computing devices. Memory 704 may include volatile or non-volatile memory including magnetic media, optical media, read-access memory (RAM), read-only memory (ROM), removable media, or any other suitable memory component or combination of memory components.

Computer system 700 includes IC design module 706 and IC simulation module 708, each of which may be implemented using any suitable combination of hardware, firmware, and software. In one example, IC design module 706 and IC simulation module 708 are implemented as one or more individual or combined software applications. For example, IC design module 706 and IC simulation module 708 may be implemented using computer instructions stored on non-transitory computer-readable media that, when executed by the one or more processors, cause the one or more processors to perform certain operations. IC design module 706 assists a user of computer system 700 with designing an IC. For example, IC design module 706 may assist a user with designing chiplets 102, including according to 2D chiplet designs 200/300/400, to be formed on a semiconductor wafer 100 and included as part of a vertical stack of a multi-chip IC. In certain embodiments, IC design module 706 includes an automated operation for facilitating the mirroring of alignment features 208 and semiconductor structures 210 from a surface 204/206 of a first chiplet 102 across a shared reference line 216 to a surface 204/206 of an adjacent second chiplet 102.

IC simulation module 708 allows a user of computer system 700 to simulate operation of the IC designed using IC design module 706. Taking a two-chiplet stack (e.g., per 2D chiplet design 200) as an example, computer system 700 may display 2D chiplet design 200 in display 710. IC simulation module 708 may allow a user to specify or otherwise request virtual tie lines 712 between a semiconductor structure 210 of first chiplet 102a and a mirrored semiconductor structure 210 of second chiplet 102b to simulate the operation of a conductive connection between those semiconductor structures 210. For simulation of the chip in a 2D simulator, virtual tie lines 712 can have zero resistance and lack layout restrictions. For visibility of virtual tie lines 712, interconnects 212 are not shown; however, in an actual implementation, IC simulation module 708 might or might not include interconnects 212 in display 710.

The design (e.g., 2D chiplet design 200/300/400) generated by computer system 700 may be used to generate one or more photomasks, which can be used to form chiplets 102 on substrate 104. For example, computer system 700 may generate a file that includes the design, and the file may be input to a photomask writer to generate the photomask.

Embodiments of this disclosure may provide technical advantages. Certain embodiments may reduce or eliminate alignment errors between alignment features 208 and semiconductor structures 210 using a 2D mirroring process adoptable into current design algorithms. Furthermore, process effects, such as pitch walking or other process variations, are similar on chiplets 102 that are stacked vertically in a multi-chip IC because those chiplets 102 were formed as part of the same semiconductor wafer 100 under the same process conditions, which reduces alignment errors caused by such process effects. Example 2D chiplet designs 200/300/400 illustrate implementations in which semiconductor structures 210 (e.g., via contacts) are located relatively close to reference line 216. This approach may further minimize process variation between the chiplet-to-chiplet contacts.

While a conventional dice-and-slide approach relies on a one-to-one copy of alignment features and semiconductor structures from one chiplet to another and on face-to-back (F2B) stacking, mirroring alignment features 208 and semiconductor structures 210 of chiplets 102 across reference line 216 to a surface of an adjacent chiplet 102 allows F2F and B2B stacking of chiplets 102. Certain embodiments allow interconnects 212 formed to connect transistors of different chiplets 102 together into complex 3D random logic cells to be formed at high density due to the ability to perform F2F stacking.

Embodiments of this disclosure are scalable to multi-chip ICs (e.g., to fabricate M3DL structures) such that as scaling continues, the number of chiplets 102 available to logic functions can also scale. Although designs for vertical stacks of two, three, and four chiplets 102 have been illustrated and described, the mirroring approach described herein may be extended for vertical stacks of more than four aligned chiplets 102. Certain embodiments allow 3D logic circuitry to be formed in a high temperature process flow, including interconnect, which can be used to design and manufacture random logic cores for microprocessor and SOC applications. Embodiments allow random logic to be fabricated in a near ideal process flow that is attainable with current tool sets with minimal new technology development. Memory structures (e.g., SRAM, Ferroelectric FETs, Resistive RAM, etc.) can be incorporated within the chiplet design. Certain embodiments provide volumetric, rather than simply areal scaling of logic devices. Embodiments can be implemented with any suitable devices, including FinFET devices and/or with nano-wire/nano-sheet devices. Additionally, because logic-based chiplets use fewer interconnects, certain embodiments provide economic and performance benefits relative to a traditional logic framework with large numbers interconnect layers for accommodating global interconnect. Because global system interconnects can be built separately from the logic cores, the global system interconnect thermal budget and fabrication can be separated from the logic fabrication, providing additional performance benefits and cost savings.

Although examples for designing and forming two-, three-, and four-layer vertical stacks have been described, it should be understood that the techniques for designing and forming multi-chip ICs can be extended to vertical stacks that include any suitable number of chiplets 102 arranged in any suitable number of layers.

Furthermore, this disclosure contemplates each chiplet 102 being formed as a single die on semiconductor wafer 100. Additionally or alternatively, this disclosure contemplates a set of chiplets 102 being formed as a single die on semiconductor wafer 100 using a photomask that includes the design for all chiplets 102 in the set of chiplets 102, such that during fabrication each die is formed using the same photomask. As just one example, a set of four chiplets could be formed as a single die on semiconductor wafer 100 using a photomask that includes the design for all four chiplets 102. As a particular example, a set of chiplets 102 (e.g., four) could be formed as one die and another set of chiplets 102 (e.g., four) could be formed as an adjacent die to eventually form an eight-chiplet vertical stack.

Example embodiments are summarized here. Other embodiments can also be understood from the entirety of the specification as well as the claims filed herein.

Example 1: A method includes forming chiplets on a substrate. Each chiplet has a first surface on a first side of the chiplet and a second surface on a second side of the chiplet. First and second chiplets are formed adjacent to each other on the substrate along first edges of the first and second chiplets. The first and second chiplets share a reference line across which alignment features and semiconductor structures on the first surface of the first chiplet are mirrored on the first surface of the second chiplet. The method includes separating the first and second chiplets from the substrate and aligning the first and second chiplets such that the first surfaces of the first and second chiplets face each other. The method further includes bonding the first chiplet to the second chiplet, as aligned, to form at least a portion of a vertical stack of a multi-chip IC. The first and second chiplets are component levels in the vertical stack.

Example 2: The method of Example 1, where the second surfaces face the substrate.

Example 3: The method of any one of Examples 1-2, where a particular semiconductor structure of the first chiplet is a first conductive via coupled to a metallization layer of the first chiplet and a mirrored semiconductor structure of the second chiplet is a second conductive via coupled to a metallization layer of the second chiplet. The first and second vias are aligned following aligning of the first and second chiplets and coupling the metallization layer of the first chiplet to the metallization layer of the second chiplet.

Example 4: The method of Example 3, where the metallization layer of the first chiplet is at a same metallization level as the metallization layer of the second chiplet.

Example 5: The method of any one of Examples 1-4, where the chiplets further include a third chiplet adjacent to the first chiplet along a second edge of the first chiplet. The first and second edges of the first chiplet are opposite edges. The first and third chiplets share a reference line across which alignment features and semiconductor structures on the second surface of the first chiplet are mirrored on the second surface of the third chiplet. The method includes separating the third chiplet from the substrate, aligning the first and third chiplets such that the second surfaces of the first and third chiplets face each other, and bonding the first chiplet and third chiplets, as aligned, to form at least a second portion of the vertical stack.

Example 6: The method of Example 5, where a first semiconductor structure of the first chiplet is a first via coupled to a first metallization layer of the first chiplet and a mirrored semiconductor structure of the second chiplet is a second via coupled to a metallization layer of the second chiplet. The first and second vias are aligned following aligning of the first and second chiplets and coupling the first metallization layer of the first chiplet to the metallization layer of the second chiplet. A second semiconductor structure of the first chiplet is a second via coupled to a second metallization layer of the first chiplet and a mirrored semiconductor structure of the third chiplet is a third via coupled to a metallization layer of the third chiplet. The second and third vias are aligned following aligning of the first and third chiplets and coupling the second metallization layer of the first chiplet to the metallization layer of the third chiplet.

Example 7: The method of Example 6, where the first and second metallization layers of the first chiplet are at a same metallization level.

Example 8: The method of Example 6, where the first and second metallization layers of the first chiplet are at different metallization levels. The first metallization layer includes interconnects extending in a first direction, and the second metallization layer includes interconnects extending in a different second direction.

Example 9: The method of any one of Examples 5-8, where a layout of alignment features and semiconductor structures on the first surface of the first chiplet differs from a layout of those on the second surface of the first chiplet.

Example 10: The method of any one of Examples 1-9, where the chiplets further include third and fourth chiplets. The third chiplet is formed adjacent to the first chiplet along a second edge of the first chiplet. The fourth chiplet is formed adjacent to the second chiplet along a second edge of the second chiplet and adjacent to the third chiplet along a first edge of the third chiplet. The third and fourth chiplets share a reference line across which alignment features and semiconductor structures on the first surface of the third chiplet are mirrored on the first surface of the fourth chiplet. The method includes separating the third and fourth chiplets from the substrate, aligning the third and fourth chiplets such that the first surface of the third chiplet faces the first surface of the fourth chiplet, and bonding the third chiplet to the fourth chiplet, as aligned, to form at least a second portion of the vertical stack.

Example 11: The method of Example 10, where the third and first chiplets share a reference line across which alignment features and semiconductor structures on the second surface of the first chiplet are mirrored on the second surface of the third chiplet. The method includes aligning the first and third chiplets such that the second surfaces of the first and third chiplets face each other and bonding the first chiplet to the third chiplet, as aligned, to form a combined portion of the vertical stack that includes the first, second, third, and fourth chiplets.

Example 12: The method of any one of Examples 1-11, where, in addition to the first, second, third, and fourth chiplets, the vertical stack includes one or more additional chiplets that each include alignment features and semiconductor structures mirrored on an overlying or underlying chiplet of the vertical stack.

Example 13: The method of any one of Examples 1-11, where at least two chiplets include a layer of FETs and a metal layer positioned above the layer of FETs.

Example 14: A method includes generating one or more photomasks made from a 2D design for fabricating chiplets on a substrate. The chiplets are component levels for a multi-chip IC. The 2D design includes a first layout for first alignment features and first semiconductor structures to be formed on a first surface of a first chiplet and a second layout for second alignment features and second semiconductor structures to be formed on a first surface of a second chiplet. The second chiplet is adjacent to the first chiplet on the substrate. The second layout is a mirror image of the first layout across a reference line shared by the first and second chiplets. The first surfaces of the first and second chiplets both are either top or bottom surfaces. The method includes forming the chiplets using the one or more photomasks such that the first surface of the first chiplet includes the first alignment features and the first semiconductor structures arranged according to the first layout and the first surface of the second chiplet includes the second alignment features and the second semiconductor structures arranged according to the second layout.

Example 15: The method of Example 14, where a particular first semiconductor structure is a via coupled to a metallization layer of the first chiplet and a mirrored second semiconductor structure is a via coupled to a metallization layer of the second chiplet.

Example 16: The method of any one of Examples 14-15, where the 2D design further includes a third layout for third alignment features and third semiconductor structures to be formed on a second surface of the first chiplet and a fourth layout for fourth alignment features and fourth semiconductor structures to be formed on a first surface of a third chiplet. The first and third chiplets are adjacent. The fourth layout is a mirror image of the third layout across a reference line shared by the first and third chiplets. The second surface of the first chiplet and the first surface of the third chiplet both are either top or bottom surfaces. As formed, the second surface of the first chiplet includes the third alignment features and the third semiconductor structures arranged according to the third layout, and the first surface of the third chiplet includes the fourth alignment features and the fourth semiconductor structures arranged according to the fourth layout.

Example 17: A method includes generating a 2D design for fabricating chiplets on a semiconductor substrate, the chiplets being component levels for a multi-chip IC. The 2D design includes a first layout for alignment features and semiconductor structures to be formed on a first surface of a first chiplet and a second layout for alignment features and semiconductor structures to be formed on a first surface of a second chiplet. The first and second chiplets are adjacent on the substrate. The second layout is a mirror image of the first layout across a reference line shared by the first and second chiplets. The first surfaces of the first and second chiplets both are either top or bottom surfaces. The method includes generating one or more photomasks according to the design.

Example 18: The method of Example 17, further including creating a virtual tie line, extending across the reference line, from a particular semiconductor structure to be formed on the first surface of the first chiplet to a mirrored semiconductor structure to be formed on the first surface of the second chiplet to simulate in a 2D simulator a conductive connection between the particular semiconductor structure and the mirrored semiconductor structure.

Example 19: The method of Example 18, where the particular semiconductor structure is a via coupled to a metallization layer of the first chiplet, and the mirrored semiconductor structure is a via coupled to a metallization layer of the second chiplet.

Example 20: The method of any one of Examples 17-19, where the 2D design includes a third layout for alignment features and semiconductor structures to be formed on a second surface of the first chiplet and a fourth layout for alignment features and semiconductor structures to be formed on a first surface of a third chiplet. The first and third chiplets are adjacent on the substrate. The fourth layout is a mirror image of the third layout across a reference line shared by the first and third chiplets. The second surface of the first chiplet and the first surface of the third chiplet both are either top or bottom surfaces.

While this disclosure has been described with reference to illustrative embodiments, this description is not intended to be construed in a limiting sense. Various modifications and combinations of the illustrative embodiments, as well as other embodiments of the disclosure, will be apparent to persons skilled in the art upon reference to the description. It is therefore intended that the appended claims encompass any such modifications or embodiments.

What is claimed is:

1. A method for fabricating a semiconductor device, the method comprising:
   forming a plurality of chiplets on a substrate of a semiconductor wafer, each chiplet of the plurality of chiplets having a first surface on a first side of the chiplet and a second surface on a second side of the chiplet, a first chiplet and a second chiplet of the plurality of chiplets being formed adjacent to each other on the substrate of the semiconductor wafer along a first edge of the first chiplet and a first edge of the second chiplet, the first chiplet and the second chiplet sharing a reference line across which alignment features and semiconductor structures on the first surface of the first chiplet are mirrored on the first surface of the second chiplet;
   separating the first chiplet and the second chiplet from the substrate;
   aligning the first chiplet and the second chiplet such that the first surface of the first chiplet faces the first surface of the second chiplet; and
   bonding the first chiplet to the second chiplet, as aligned, to form at least a first portion of a vertical stack of a multi-chip integrated circuit, the first chiplet and the second chiplet being component levels in the vertical stack.

2. The method of claim 1, wherein the second surfaces of the plurality of chiplets face the substrate.

3. The method of claim 1, wherein a particular semiconductor structure of the first chiplet is a first conductive via coupled to a metallization layer of the first chiplet and a mirrored semiconductor structure of the second chiplet is a second conductive via coupled to a metallization layer of the second chiplet, the first conductive via and the second conductive via being aligned following aligning of the first chiplet and the second chiplet and coupling the metallization layer of the first chiplet to the metallization layer of the second chiplet.

4. The method of claim 3, wherein the metallization layer of the first chiplet is at a same metallization level as the metallization layer of the second chiplet.

5. The method of claim 1, wherein at least two chiplets of the plurality of chiplets include a layer of field effect transistors and a metal layer positioned above the layer of field effect transistors.

6. The method of claim 1, wherein separating the first chiplet and the second chiplet from the substrate comprises dicing the semiconductor wafer such that some or all of the substrate that underlies the first chiplet remains with the first chiplet and some or all of the substrate that underlies the second chiplet remains with the second chiplet.

7. A method for fabricating a semiconductor device, the method comprising:
   forming a plurality of chiplets on a substrate, each chiplet of the plurality of chiplets having a first surface on a first side of the chiplet and a second surface on a second side of the chiplet, the plurality of chiplets comprising a first chiplet, a second chiplet and a third chiplet, wherein:
      the first chiplet and the second chiplet are formed adjacent to each other on the substrate along a first edge of the first chiplet and a first edge of the second chiplet, the first chiplet and the second chiplet sharing a reference line across which alignment features and semiconductor structures on the first surface of the first chiplet are mirrored on the first surface of the second chiplet, and
      the third chiplet is formed adjacent to the first chiplet on the substrate along a second edge of the first chiplet, the second edge of the first chiplet being opposite the first edge of the first chiplet, the first chiplet and the third chiplet sharing a reference line across which alignment features and semiconductor structures on the second surface of the first chiplet are mirrored on the second surface of the third chiplet;
   separating the first chiplet and the second chiplet from the substrate;
   aligning the first chiplet and the second chiplet such that the first surface of the first chiplet faces the first surface of the second chiplet;
   bonding the first chiplet to the second chiplet, as aligned, to form at least a first portion of a vertical stack of a multi-chip integrated circuit, the first chiplet and the second chiplet being component levels in the vertical stack;
   separating the third chiplet from the substrate;
   aligning the first chiplet and the third chiplet such that the second surface of the first chiplet faces the second surface of the third chiplet; and
   bonding the first chiplet to the third chiplet, as aligned, to form at least a second portion of the vertical stack of the multi-chip integrated circuit.

8. The method of claim 7, wherein:
   a first semiconductor structure of the first chiplet is a first conductive via coupled to a first metallization layer of the first chiplet and a mirrored semiconductor structure of the second chiplet is a second conductive via coupled to a metallization layer of the second chiplet, the first conductive via and the second conductive via being aligned following aligning of the first chiplet and the second chiplet and coupling the first metallization layer of the first chiplet to the metallization layer of the second chiplet; and
   a second semiconductor structure of the first chiplet is a second conductive via coupled to a second metallization layer of the first chiplet and a mirrored semiconductor structure of the third chiplet is a third conductive via coupled to a metallization layer of the third chiplet, the second conductive via and the third conductive via being aligned following aligning of the first chiplet and the third chiplet and coupling the second metallization layer of the first chiplet to the metallization layer of the third chiplet.

9. The method of claim 8, wherein the first metallization layer of the first chiplet and the second metallization layer of the first chiplet are at a same metallization level.

10. The method of claim 8, wherein:
the first metallization layer of the first chiplet and the second metallization layer of the first chiplet are at different metallization levels; and
the first metallization layer comprises interconnects extending in a first direction and the second metallization layer comprises interconnects extending in a second direction, the second direction being different than the first direction.

11. The method of claim 7, wherein a layout of alignment features and semiconductor structures on the first surface of the first chiplet mirrored on the first surface of the second chiplet differs from a layout of alignment features and semiconductor structures on the second surface of the first chiplet mirrored on the second surface of the third chiplet.

12. The method of claim 7, wherein the second surfaces of the plurality of chiplets face the substrate.

13. The method of claim 7, wherein at least two chiplets of the plurality of chiplets include a layer of field effect transistors and a metal layer positioned above the layer of field effect transistors.

14. The method of claim 7, wherein following separating the first chiplet and the second chiplet from the substrate, some or all of the substrate that underlies the first chiplet remains with the first chiplet and some or all of the substrate that underlies the second chiplet remains with the second chiplet.

15. A method for fabricating a semiconductor device, the method comprising:
forming a plurality of chiplets on a substrate, each chiplet of the plurality of chiplets having a first surface on a first side of the chiplet and a second surface on a second side of the chiplet, the plurality of chiplets comprising a first chiplet, a second chiplet, a third chiplet, and a fourth chiplet, wherein:
the first chiplet and the second chiplet are formed adjacent to each other on the substrate along a first edge of the first chiplet and a first edge of the second chiplet, the first chiplet and the second chiplet sharing a reference line across which alignment features and semiconductor structures on the first surface of the first chiplet are mirrored on the first surface of the second chiplet;
the third chiplet is formed adjacent to the first chiplet on the substrate along a second edge of the first chiplet;
the fourth chiplet is formed adjacent to the second chiplet on the substrate along a second edge of the second chiplet and adjacent to the third chiplet on the substrate along a first edge of the third chiplet; and
the third chiplet and the fourth chiplet share a reference line across which alignment features and semiconductor structures on the first surface of the third chiplet are mirrored on the first surface of the fourth chiplet;
separating the first chiplet and the second chiplet from the substrate;
aligning the first chiplet and the second chiplet such that the first surface of the first chiplet faces the first surface of the second chiplet;
bonding the first chiplet to the second chiplet, as aligned, to form at least a first portion of a vertical stack of a multi-chip integrated circuit, the first chiplet and the second chiplet being component levels in the vertical stack;
separating the third chiplet and the fourth chiplet from the substrate;
aligning the third chiplet and the fourth chiplet such that the first surface of the third chiplet faces the first surface of the fourth chiplet; and
bonding the third chiplet to the fourth chiplet, as aligned, to form at least a second portion of the vertical stack of the multi-chip integrated circuit.

16. The method of claim 15, wherein:
the third chiplet and the first chiplet share a reference line across which alignment features and semiconductor structures on the second surface of the first chiplet are mirrored on the second surface of the third chiplet; and
the method further comprises:
aligning the first chiplet and the third chiplet such that the second surface of the first chiplet faces the second surface of the third chiplet; and
bonding the first chiplet to the third chiplet, as aligned, to form a combined portion of the vertical stack of the multi-chip integrated circuit, the combined portion comprising the first chiplet, the second chiplet, the third chiplet, and the fourth chiplet.

17. The method of claim 15, wherein, in addition to the first chiplet, the second chiplet, the third chiplet, and the fourth chiplet, the vertical stack comprises one or more additional chiplets that each include alignment features and semiconductor structures mirrored on an overlying or underlying chiplet of the vertical stack.

18. The method of claim 15, wherein the second surfaces of the plurality of chiplets face the substrate.

19. The method of claim 15, wherein at least two chiplets of the plurality of chiplets include a layer of field effect transistors and a metal layer positioned above the layer of field effect transistors.

20. The method of claim 15, wherein, wherein following separating the first chiplet and the second chiplet from the substrate, some or all of the substrate that underlies the first chiplet remains with the first chiplet and some or all of the substrate that underlies the second chiplet remains with the second chiplet.

* * * * *